United States Patent
Lyden et al.

(10) Patent No.: US 7,136,005 B1
(45) Date of Patent: Nov. 14, 2006

(54) ACCURATE LOW NOISE ANALOG TO DIGITAL CONVERTER SYSTEM

(75) Inventors: Colin G. Lyden, Baltimore Co. Cork (IE); Michael C. Coln, Lexington, MA (US); Robert Brewer, Lambourn (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/122,587

(22) Filed: May 5, 2005

(51) Int. Cl.
*H03M 1/50* (2006.01)
(52) U.S. Cl. .................................. 341/166; 341/155
(58) Field of Classification Search .............. 330/59, 330/308–309; 327/9, 63, 74; 250/214 R, 250/214 A; 341/155, 166, 167, 168, 169
See application file for complete search history.

(56) References Cited

U.S. PATENT DOCUMENTS 5,002,392 A * 3/1991 Swope et al. ............... 356/328
5,367,154 A * 11/1994 Pfeiffer ....................... 250/208.1
5,959,292 A     9/1999 Duveneck et al.
6,172,353 B1    1/2001 Jensen
6,660,991 B1   12/2003 Brombacher et al.

* cited by examiner

*Primary Examiner*—Brian Young
(74) *Attorney, Agent, or Firm*—Iandiorio & Teska (57) ABSTRACT

An accurate, low noise conditionally resetting integrator circuit in an analog to digital system samples, with an analog to digital converter, the output of an integrating circuit a number of times during a measuring period; isolates the input for the integrating circuit during sample event; generates a reset signal in response to the integrating circuit output reaching a predetermined level; and resets the feedback capacitor of the integrating circuit by isolating it from the amplifier circuit of the integrating circuit and connecting it to a reference source during a sample event.

21 Claims, 7 Drawing Sheets

ACCURATE LOW NOISE ANALOG TO DIGITAL CONVERTER SYSTEM

FIELD OF THE INVENTION

This invention relates to an improved accurate, low noise analog to digital converter system.

BACKGROUND OF THE INVENTION

Wide dynamic range and low noise are desirable qualities of analog to digital converter systems e.g. those used in computed tomography (CT) scanners. In that environment there is a particularly great demand for a wide dynamic range, e.g., 120 dB to accommodate very bright radiation passing through low density body areas. But at the low end it is also desirable to have very low noise to improve the quality and contrast of low level radiation passing through bone, for example. One approach to this issue has been to apply a conditional reset which can be done a number of times in a measuring period to accommodate larger signals and even less than one per measuring period to reduce noise at lower signals. One such approach is disclosed in U.S. Pat. No. 6,660,991, Brombacher et al. However, in that approach the input charge is dissipated during reset making the output less accurate and during reset the noise form the amplifier is communicated to the feedback capacitor. Brombacher et al. for one, attempts to mitigate these problems by interpolation and filtering of delta values but this is inherently inexact and information will be lost.

BRIEF SUMMARY OF THE INVENTION

It is therefore an object of this invention to provide an improved more accurate low noise analog to digital converter system.

It is a further object of this invention to provide such an improved more accurate low noise analog to digital converter system which isolates the input from the feedback capacitor and integrator circuit amplifier to preserve charge and reduce reset noise.

It is a further object of this invention to provide an improved more accurate low noise analog to digital converter system which isolates the integrator circuit amplifier from the feedback capacitor to reduce noise.

It is a further object of this invention to provide an improved more accurate low noise analog to digital converter system which decouples the resetting from the analog to digital converter (ADC) avoiding ADC latency in the reset path and providing faster reset response.

It is a further object of this invention to provide an improved more accurate low noise analog to digital converter system which with decoupling of the resetting enables the ADC to be multiplexed with many integrator channels.

It is a further object of this invention to provide an improved more accurate low noise analog to digital converter system which provides better estimation of the average input over the measuring period.

The invention results from the realization that a more accurate, lower noise conditional resetting integrator circuit in an analog to digital converter system can be achieved by sampling with an analog to digital converter the output of an integrating circuit a number of times during a measuring period; isolating the input from the integrating circuit during a sample event; generating a reset signal in response to the integrating circuit output reaching a predetermined level; and resetting the feedback capacitor of the integrating circuit by isolating it from the amplifier circuit of the integrating circuit and connecting it to a reference source during a sample event.

The subject invention, however, in other embodiments, need not achieve all these objectives and the claims hereof should not be limited to structures or methods capable of achieving these objectives.

This invention features an improved accurate, low noise analog to digital converter system including an integrator circuit having an amplifier circuit and a feedback capacitor and an analog to digital converter with its input coupled to the integrator circuit output for sampling the integrator circuit output at least once each measuring period. A conditional reset circuit resets the feedback capacitor after a predetermined integrator circuit output voltage has been reached; and the switching system selectively isolates the feedback capacitor during sampling and reset.

In a preferred embodiment there may be a sample reconstruction circuit responsive to the output of the analog to digital converter for reconstructing the output of the integrator circuit. The sample reconstruction circuit may include a digital computation circuit for determining the difference between the values of each sample occurring during a measuring period and adding the value of any sample event at which the feedback capacitor has been reset for reconstructing the output of the integrator circuit. The sample reconstruction circuit may include a reset event correction circuit and a slope estimation computation circuit. The switching system may include an input hold switching circuit for isolating the integrator circuit from the input during a sampling event. The conditional reset circuit may include a reset switching circuit for connecting the feedback capacitor to a reference voltage source during a conditional reset. The switching system may include an isolation switching circuit for isolating the amplifier circuit from the feedback capacitor during a conditional reset. The digital computation circuit may include a storage device for storing values of samples at sampling events and values of samples at which the feedback capacitor has been reset. The digital computation circuit may include a summing circuit for differencing sample values at sampling events and adding values of samples at which the feedback capacitor has been reset. The conditional reset circuit may include a reference voltage source. The conditional reset circuit may include a comparator for determining whether the integrator circuit output has reached a predetermined integrator circuit output voltage. The conditional reset circuit may include a reference charge source and a reset switching circuit for connecting the reference charge source to the feedback capacitor. Resetting may occur at the next sample event after a predetermined integrator circuit output voltage has been reached. The integrator circuit may receive its input from a photodiode.

The invention also features an accurate low noise method of conditionally resetting an integrator circuit in an analog to digital system including sampling, with an analog to digital converter, the output of an integrating circuit a number of times during a measuring period and isolating the input from the integrating circuit during a sample event. A reset signal is generated in response to the integrating circuit output reaching a predetermined level, and the feedback capacitor of the integrating circuit is reset by isolating it from the amplifier circuit of the integrating circuit and connecting it to a reference source during a sample event.

In a preferred embodiment the difference between the values of each sample occurring during a measuring period may be determined and the value of any sample at which the feedback capacitor has been reset may be added for reconstructing the output of the integrator circuit. The values of samples at sampling events and the values of samples at which the feedback capacitor has been reset may be stored. The reference source may include a voltage reference source or a charge reference source. The resetting may occur at the next sample event after a predetermined integrator circuit output voltage has been reached. The integrating circuit may receive an input from a photodiode.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
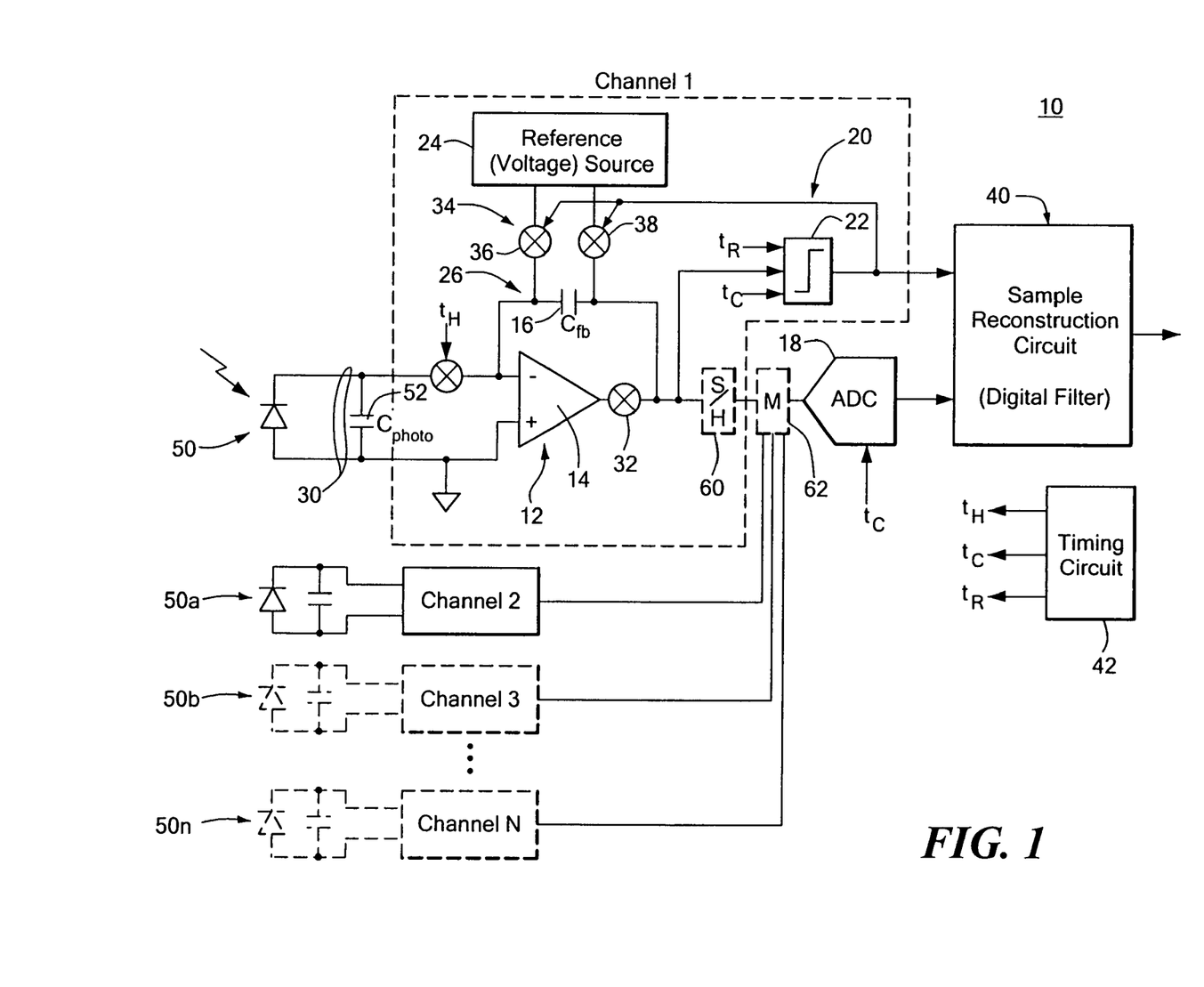
FIG. 1 is a schematic block diagram of an improved conditional resetting analog to digital converter system with isolation according to this invention.

There is shown in FIG. 1 an improved accurate, low noise analog to digital converter system 10 including an integrator circuit 12 having an amplifier 14 and feedback capacitor 16. There is an analog to digital converter 18 which samples the output of integrator circuit 12 at least once each measuring period. There is a conditional reset circuit 20 for resetting feedback capacitor 16 after a predetermined integrator circuit 12 output voltage has been reached. Conditional reset circuit 20 includes comparator 22, reference source 24, which in this particular embodiment is shown as a reference voltage source, and a switching system 26 which isolates feedback capacitor 16 during sampling and reset. Switching system 26 includes input hold switching circuit, switch 28 for isolating the integrator circuit 12 from the input 30 during a sampling event. Switching system 26 also includes an isolation switching circuit 32 for isolating the amplifier circuit 14 from the feedback capacitor 16 during a conditional reset. Conditional reset circuit 20 also includes reset switching circuit 34 including switches 36 and 38 which connects feedback capacitor 16 to reference source 24 during a conditional reset. There is a sample reconstruction circuit 40 such as a digital filter, for example, for reconstructing the output of the integrator circuit. Timing circuit 42 provides clock pulses at time $t_H$ and $t_C$ for switching system 26 and analog to digital converter 18, respectively. One typical input to this system is from a photodiode 50 having an intrinsic capacitance 52 as is typical of photodiodes used in an array in a computed tomography scanner, for example. The input to the integrating circuit 12 is from the output of photodiode 50.

In operation, integrating circuit 12 receives a charge from photodiode 50 with intrinsic capacitance 52, and it provides an output to analog to digital converter 18. An output of integrator circuit 12 is also provided to comparator 22. Analog to digital converter 18 may take any number of samples during a predetermined measuring period, for example, four samples per measuring period. A measuring period may be determined by a manufacturers specifications or other criteria. A typical measuring period for a photodiode may be 300 microseconds, for example. Each time analog to digital converter 18 samples the output of amplifier 14 input hold switch 28 is enabled by timing signal $t_H$ to open and isolate photodiode 50 with capacitance 52 from amplifier 14 and feedback capacitor 16. This accomplishes two things, first it prevents the normal capacitor noise kT/C from being communicated to feedback capacitor 16 thereby reducing noise in the system. It also prevents the loss of charge from photodiode 50 to feedback capacitor 16 and amplifier 14 during the sampling period. Instead the charge is stored on the intrinsic capacitance 52 and is submitted to amplifier 14 and feedback capacitor 16 after the sample event is over, the timing signal $t_H$ has ended and input hold switch 28 is once again closed. Comparator 22 monitors the output of amplifier 14 of integrating circuit 12. If that output voltage exceeds a predetermined voltage level indicating that the signal is large enough that it may soon exceed the limits of analog to digital converter 18, comparator 22 at the next sampling event represented by $t_C$ produces a reset signal at $t_R$ to open isolating switch 32 and close reset switches 36 and 38. This disconnects feedback capacitor 16 from amplifier 14, thereby eliminating any communication of noise from amplifier 14 to feedback capacitor 16 and applies the reference voltage from reference source 24 to reset feedback capacitor 16 to zero. This operation is explained in more detail which respect to FIGS. 2 and 3. The preferred position of input hold switch 28 as shown is at the input to amplifier 14 where it not only isolates feedback capacitor 16 but also preserves the charge on photodiode 50 during sampling events.

Typically when photodiode 50 is one of a multiplicity of photodiodes in a computer tomography scanner, the components shown in dashed line in FIG. 1 constitutes but one channel associated with one photodiode 50. But there may be many such photodiodes 50a, 50b, 50n, in numerous channels 1–N. In that case, if each channel is provided with a sample and hold circuit, such as sample and hold circuit 60, in channel 1 and a multiplexer 62 is provided at the input to analog to digital converter 18, then a large number of channels and their associated photodiodes may be served by the single analog to digital converter 18. One of the advantages of this invention is the use of comparator 22 or a similar device which operates to provide the resetting of the feedback capacitor. Previously the resetting is derived from the output of the analog to digital converter. In this invention the resetting is associated with comparator 22 or a similar device and is decoupled from the output of the analog to digital converter thereby avoiding the analog to digital converter latency in the reset path and providing faster reset response. And this advantage is all the more important when analog to digital converter 18 is multiplexed to serve a multiplicity of channels.

Figure 2:
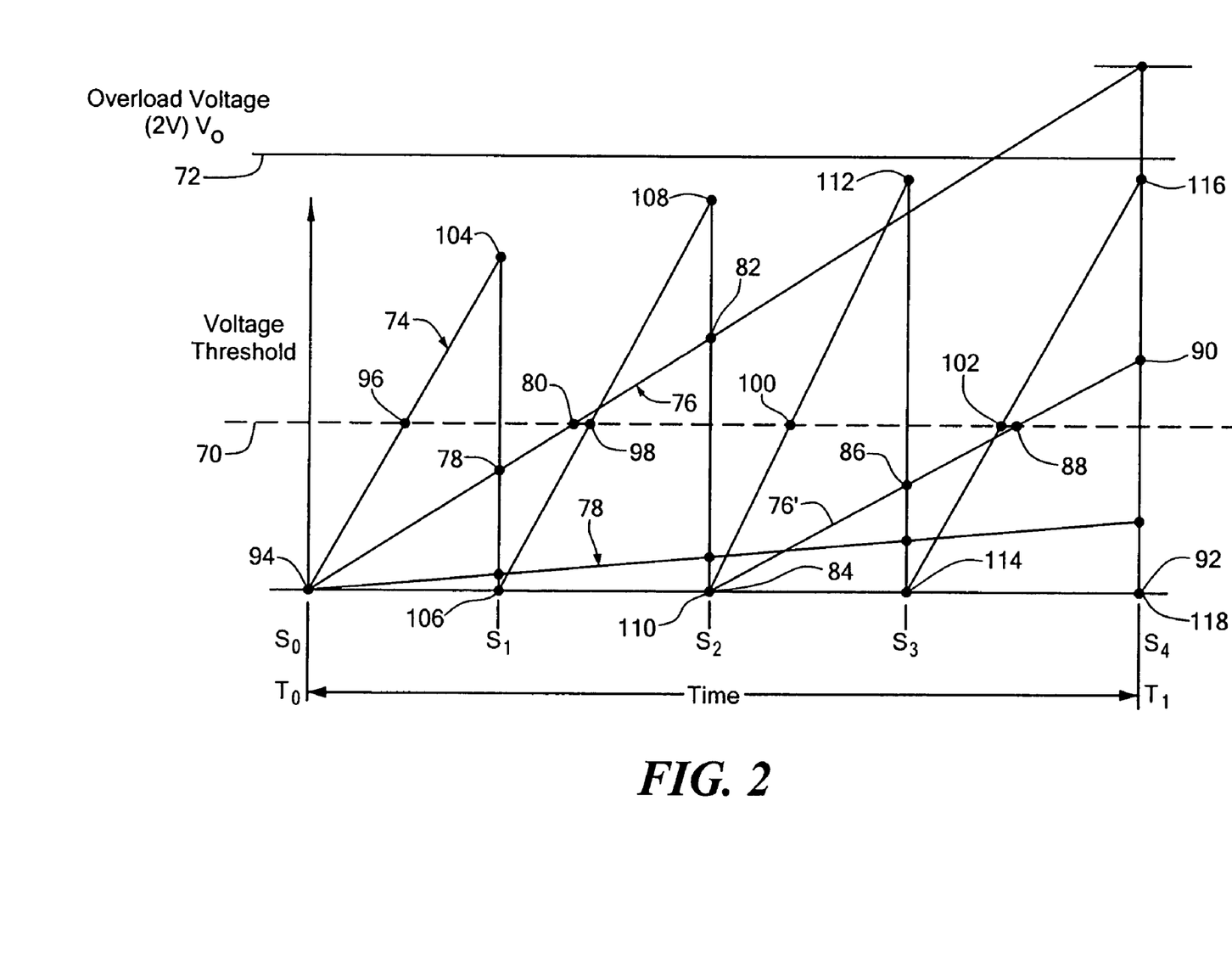
FIG. 2 shows waveforms illustrating sampling and conditional resetting of the system of FIG. 1 with respect to three different strength signals.

The operation of the conditional resetting can be seen more clearly with reference to FIG. 2 where the ordinate represents voltage and the abscissa, time. The predetermined threshold to which comparator 22 is responsive is shown at 70, e.g. ~½ the saturation voltage and the overload or saturation voltage is indicated at 72, e.g. ~2.0V. The measuring period $T_1$, for example 300, microseconds contains four sample events indicated at $S_1$, $S_2$, $S_3$, and $S_4$ with sample event $S_4$ being coincident with the end of measuring period $T_1$. There are three signals of different strength or slope in FIG. 2, a steep one 74 and an intermediate one 76 and a shallow one 78. Beginning with intermediate slope 76 it can be seen that at sample time $S_1$ indicated at 78, signal 76 has not exceeded threshold 70. It does so however at 80 so that at the next sample time, $S_2$, it will be reset at 82 back to zero at 84. The output of integrating circuit 12 continues along line 76' then and at sample event $S_3$ it can be seen at 86 that the threshold 70 has not been reached. But it will be reached at 88 so that at the next sample event, $S_4$, it will be reset at 90 back to zero 92. The sample reconstruction performed by circuit 40 in FIG. 1 can be seen then, with reference to FIG. 2, as easily obtainable by subtracting from the final value at 90, the initial value at the origin 94 and then adding in any intermediate reset sample value, which would be the value at 82 represented by the distance between 82 and the reset at 84 to zero. For the steeper slope or stronger signal 74 it can be seen that that signal exceeds threshold 70 within each sample time at 96, 98, 100, and 102 and so at each sample time $S_1$, $S_2$, $S_3$, $S_4$ there will be a reset from 104 to 106, 108 to 110, 112 to 114, and 116 to 118. Here again the total output is the final value at 116 minus the initial (zero) at 94 plus the values at each of the sample events 104, 108 and 112. Thus a very high signal, for example, a signal that has gone through low density flesh in a CT scan can be accommodated by this oversampling of the input signal, even though the entire signal would far exceed the saturation level 72. With respect to the very shallow or low signal 78 it can be seen that in each of the sample events $S_1$, $S_2$, $S_3$, $S_4$ it does not exceed threshold 70 and therefore, there need be no resetting in this measuring period and perhaps for additional measuring periods in the future. By reducing the number of resets this way noise is further reduced.

Figure 3:
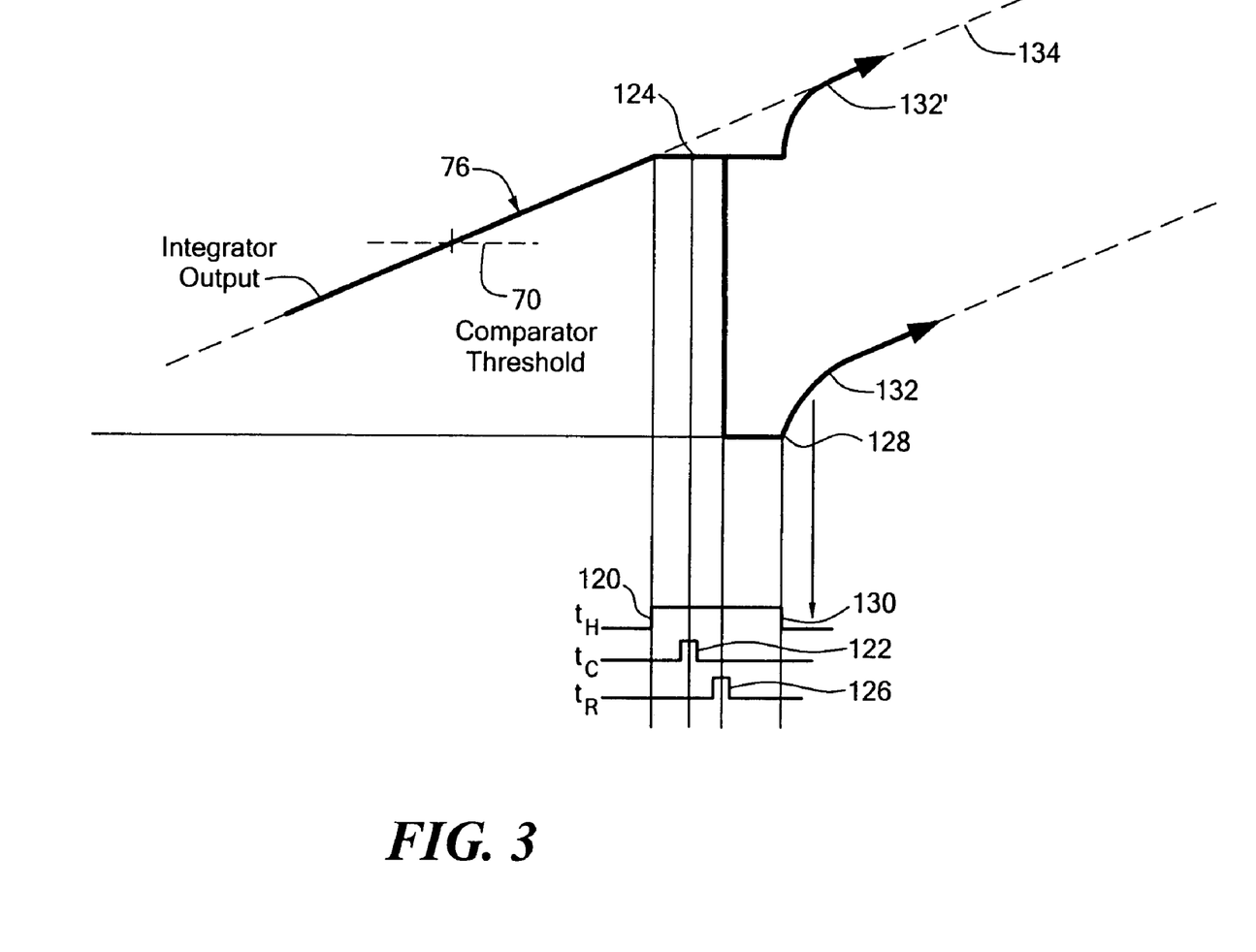
FIG. 3 is an enlarged detailed view of a portion of a waveform illustrating the sampling and resetting switching.

The actual switching effected by $t_H$, $t_C$ and $t_R$ can be seen in FIG. 3 with respect to a portion of the intermediate slope signal 76. There it can be seen that signal 76 has crossed the threshold at 70. Upon receiving clock signal $t_H$ indicated at 120, FIG. 3, switch 28, FIG. 1, is opened. This prevents charge from moving from photodiode 50 into integrating circuit 12 during sampling. A short time after, at $t_C$, timing signal 122 causes analog to digital converter 18 to take a sample at 124. Since signal 76 has crossed threshold 70 comparator 22 will provide $t_R$, pulse 126, to reset to zero at 128. $t_H$ signal 120, then ends at 130. Switch 28 is once again closed so that the charge on it, indicated at 132, is once again delivered to the integrating circuit 12. Had threshold 70 not been crossed there would be no reset to zero at 128 and instead at the end, 130, of $t_H$ pulse 120, the additional charge 132 would be added as shown as 132', and the system would continue along the dashed line 134.

Figure 4:
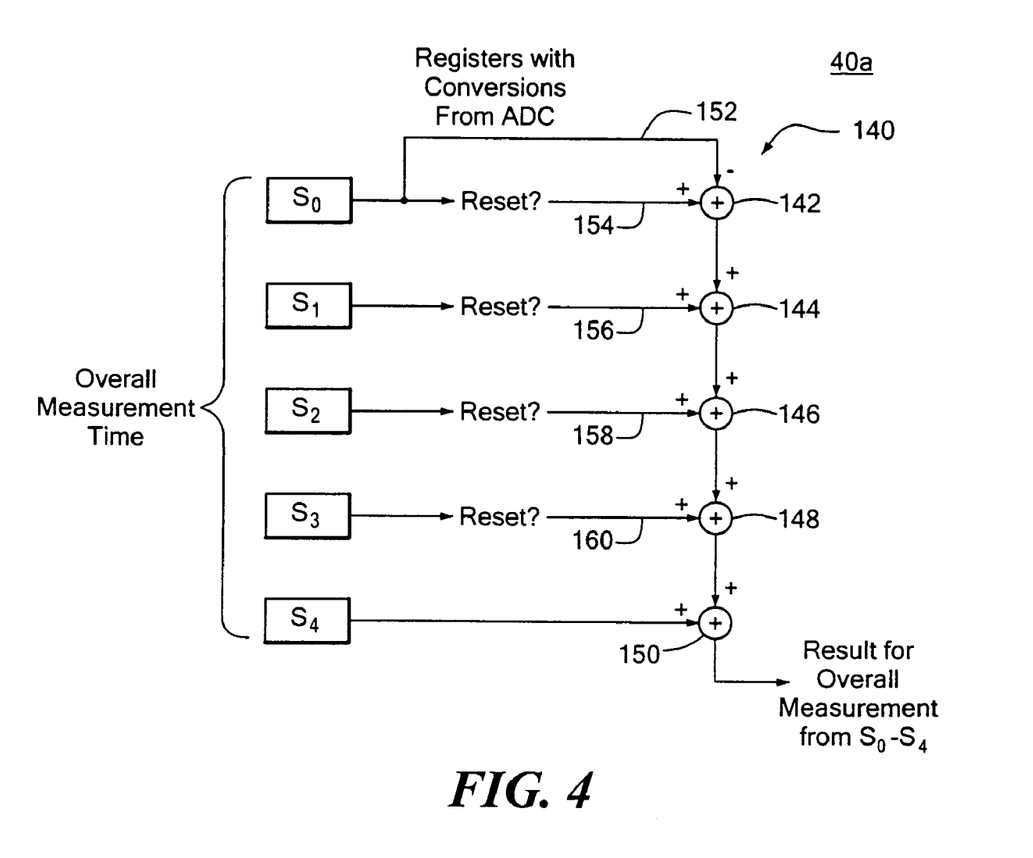
FIG. 4 is a schematic block diagram of a sample reconstruction circuit for the system of FIG. 1.

One implementation of a sample reconstruction circuit 40, FIG. 1, is shown in FIG. 4, where a sample reconstruction circuit 40a includes a number of storage devices $S_0$ through $S_4$ representing the sample events shown in FIG. 2. There is also a digital computation circuit 140 which determines the difference or delta between the values of each sample occurring during a measuring period, then adds the values of any sample events at which the feedback capacitor has been reset in order to reconstruct the output of the integrator circuit. Here the digital computation circuit 140 includes a plurality of summers 142, 144, 146, 148, and 150. This simple calculation is expressed by the equation Result=Final−Initial+Intermediate reset samples.     (1)

Thus summing circuit 142 receives one input at 152 from storage $S_0$ and receives the second input from storage $S_0$ on line 154 if there has been a reset. Similarly summing circuit 144, 146, and 148 will receive an input from the previous summing circuit and, if there has been a reset it will also receive an input 156, 158, 160 from the associated storage, $S_1$, $S_2$, $S_3$. The final summer 150 receives an input from the previous summer 148 and an input from storage $S_4$.

Figure 5:
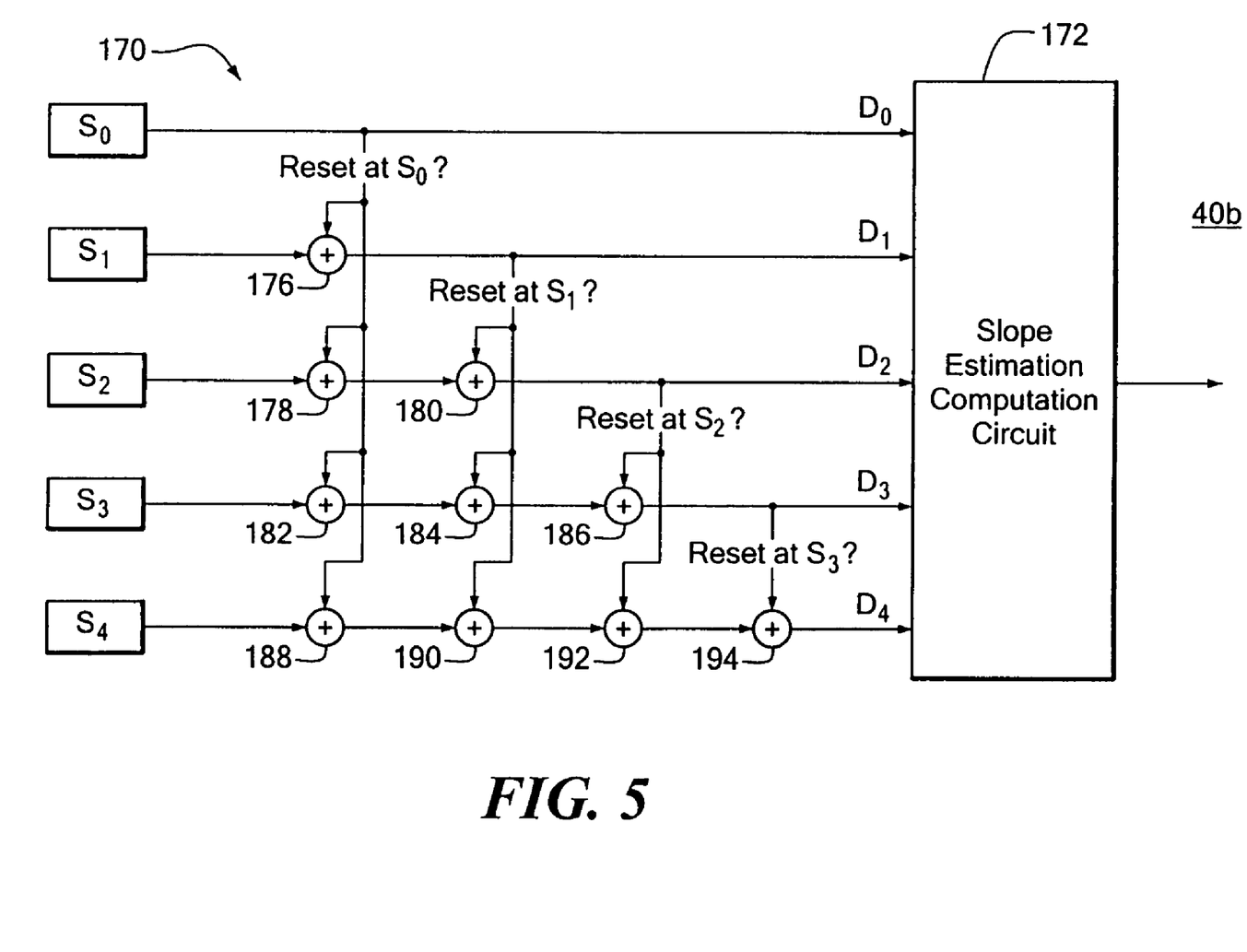
FIG. 5 is a schematic block diagram similar to that of FIG. 4 of a sample reconstruction circuit using a slope estimation computation circuit.

Instead of employing the difference or delta to reconstruct the output of the integrator circuit, the sample reconstruction circuit 40b, FIG. 5, may include a reset event correction circuit 170 and a slope estimation computation circuit 172, which for example may be a least squares approximation circuit well known in the art. In this case the reset event correction circuit 170 also includes storage devices $S_0$–$S_4$ but the summing circuits 176 are arranged so that the outputs $D_0, D_1, D_2, D_3, D_4$, are calculated as shown by equations (2), (3), (4), (5), and (6).

$$D_0 = S_0 \tag{2}$$

$$D_1 = S_1 + \text{if reset at } S_0 \text{ add } S_0 \tag{3}$$

$$D_2 = S_2 + \text{if reset at } S_0 \text{ add } S_0 + \text{if reset at } S_1 \text{ add } S_1 \tag{4}$$

$$D_3 = S_3 + \text{if reset at } S_0 \text{ add } S_0 + \text{if reset at } S_1 \text{ add } S_1 + \text{if reset at } S_2 \text{ add } S_2 \tag{5}$$

$$D_4 = S_4 + \text{if reset at } S_0 \text{ add } S_0 + \text{if reset at } S_1 \text{ add } S_1 + \text{if reset at } S_2 \text{ add } S_2 + \text{if reset at } S_3 \text{ add } S_3 \tag{6}$$

Figure 6:
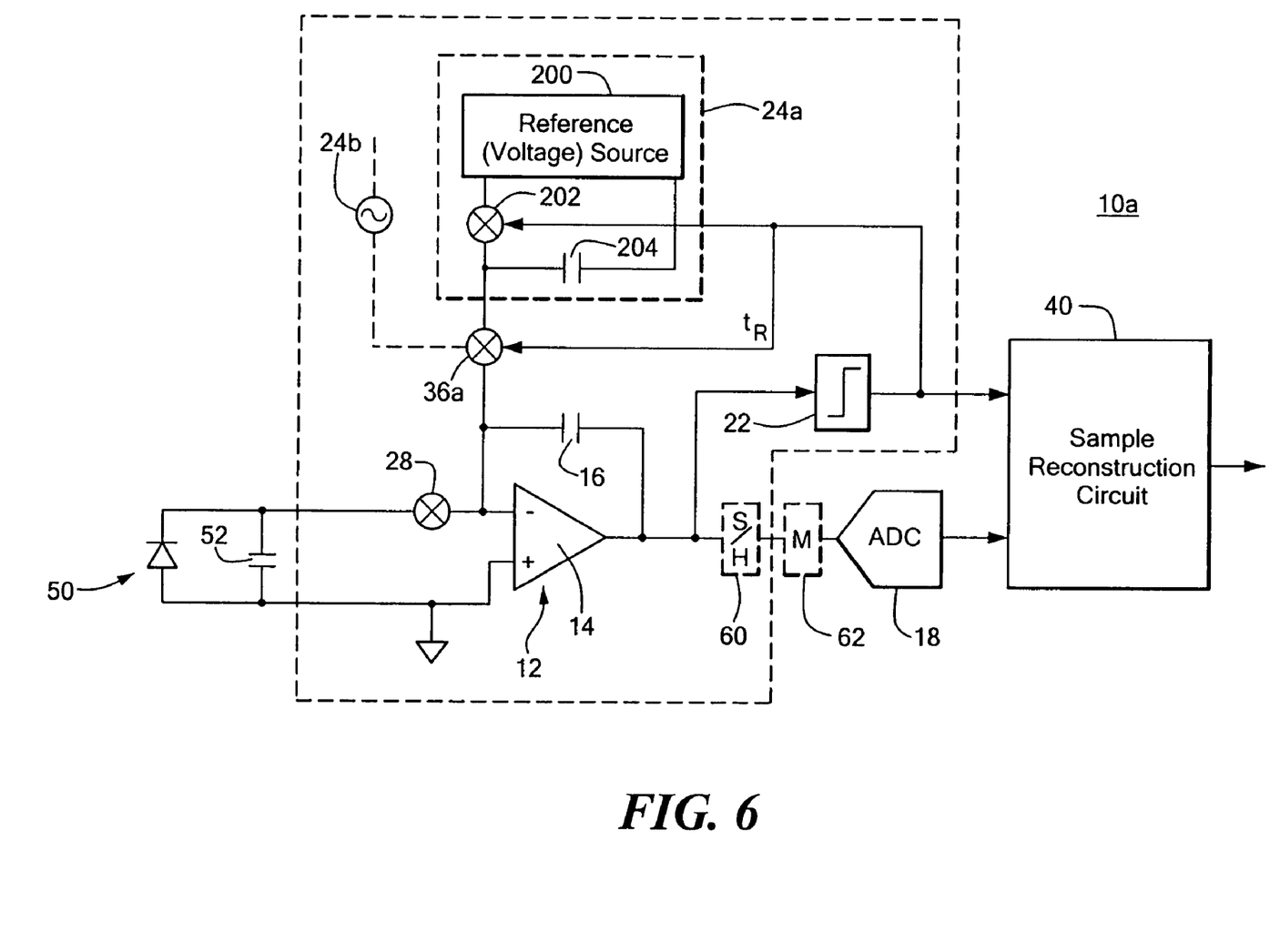
FIG. 6 is a schematic block diagram of an improved conditional resetting analog to digital converter system with isolation similar to FIG. 1 using a reference charge source.

Although thus far the system has been shown using a reference source 24, FIG. 1, which is voltage reference source, this is not a necessary limitation of the invention. For example, the reference source may be a reference charge source 24a, FIG. 6, instead of a reference voltage source as shown at 24 in FIG. 1. This may be accomplished as shown in FIG. 6 by creating a voltage charge source 24a from a reference voltage source 200 coupled with switch 202 and charge source capacitor 204. The rest of the system operates as previously explained except that normally switch 202 is closed in order to charge charge capacitor 204. Upon the appearance of a reset signal from comparator 22, switch 202 is opened disconnecting charge capacitor 204 from reference voltage source 200 and switch 36a is closed connecting charge capacitor 204 to feedback capacitor 16 adding a fixed amount of charge to it instead of resetting it to zero volts. In this configuration isolating switch 32 is eliminated. Instead of reference charge source 24a the charge may be supplied by a current source 24b through switch 36a for a specific time period so that again a fixed charge is introduced to feedback capacitor 16. Although throughout this explanation the charges have been positive rather than negative, e.g., charge is drained from rather than added to feedback capacitor 16, this is simply one example. If the polarity of photodiode 50 was reversed throughout then the voltage ramps out of the integrating circuit would be negative-going rather than positive-going and the reference would be adding charge rather than draining it.

Figure 7:
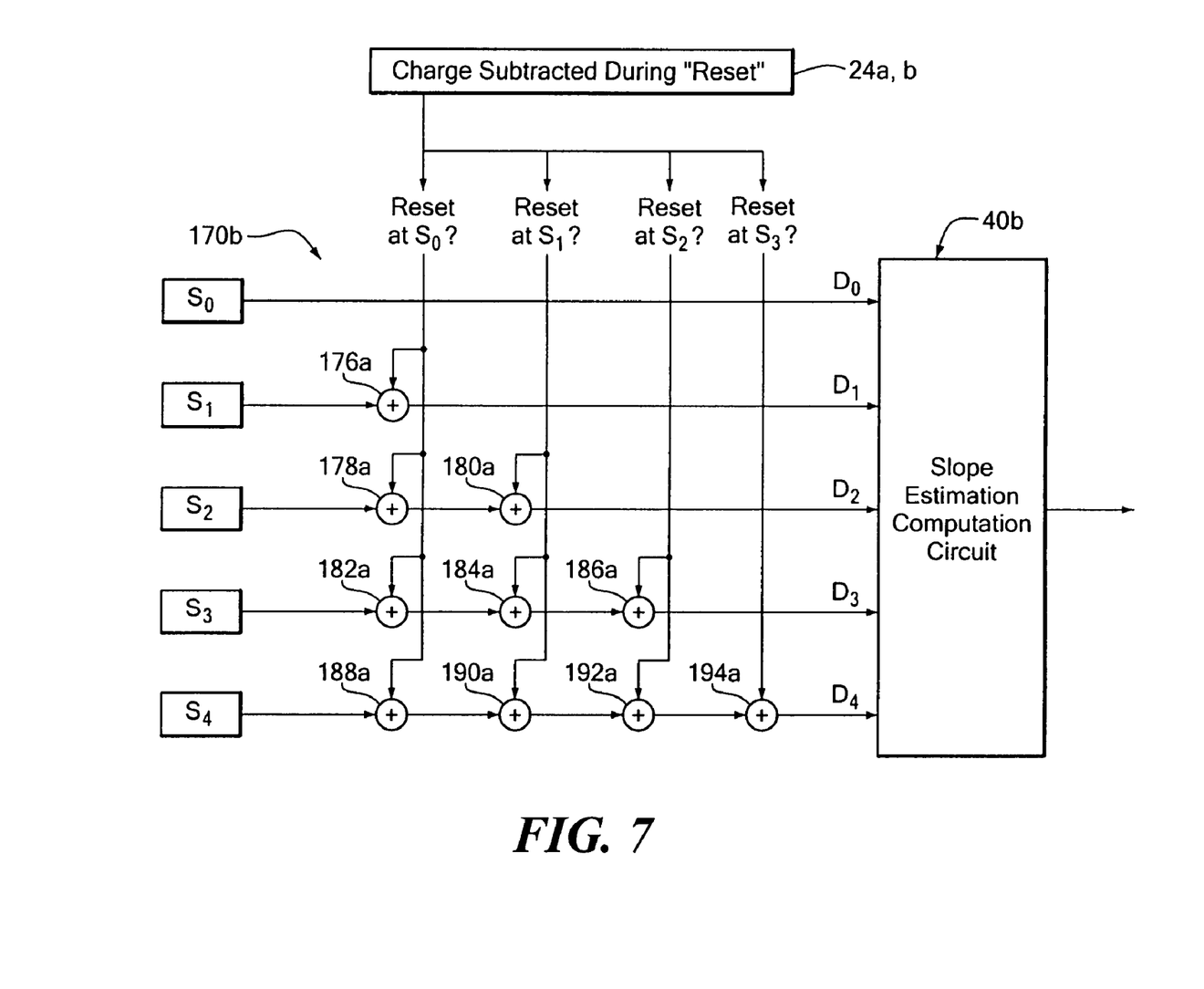
FIG. 7 is a schematic block diagram of a sample reconstruction circuit similar to FIG. 5 for the system of FIG. 6.

In the implementation of the system of FIG. 6 the sample reconstruction circuit 40 may be implemented using a slope estimation computation circuit 40b, FIG. 7. The reset event correction circuit 170b also includes storage devices $S_0$–$S_4$. Here the reference charge source 24a, b drains charge during reset so that summing circuits 176a–194a add back that specific charge whenever there has been a reset at that sample event. In this case the final result or output $D_0$–$D_4$ is as shown by equations (7) through (11).

$$D_0 = S_0 \quad (7)$$

$$D_1 = S_1 + (\text{if reset at } S_0 \text{ add } C_R) \quad (8)$$

$$D_2 = S_2 + (\text{if reset at } S_0 \text{ add } C_R) + (\text{if reset at } S_1 \text{ add } C_R) \quad (9)$$

$$D_3 = S_3 + (\text{if reset at } S_0 \text{ add } C_R) + (\text{if reset at } S_1 \text{ add } C_R) + (\text{if reset at } S_2 \text{ add } C_R) \quad (10)$$

$$D_4 = S_4 + (\text{if reset at } S_0 \text{ add } C_R) + (\text{if reset at } S_1 \text{ add } C_R) + (\text{if reset at } S_2 \text{ add } C_R) + (\text{if reset at } S_3 \text{ add } C_R) \quad (11)$$

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An improved, accurate, low noise analog to digital converter system comprising:
   an integrator circuit including an amplifier circuit and a feedback capacitor;
   an analog to digital converter with its input coupled to said integrator circuit output for sampling said integrator circuit output at least once each measuring period;
   a conditional reset circuit for resetting said feedback capacitor after a predetermined integrator circuit output voltage has been reached; and
   a switching system for selectively isolating said feedback capacitor during sampling and reset.

2. The improved, accurate, low noise analog to digital converter system of claim 1 further including a sample reconstruction circuit responsive to the output of said analog to digital converter for reconstructing the output of said integrator circuit.

3. The improved, accurate, low noise analog to digital converter system of claim 2 in which said sample reconstruction circuit includes a digital computation circuit for determining the difference between the values of each sample occurring during a measuring period and adding the value of any sample event at which the feedback capacitor has been reset for reconstructing the output of said integrator circuit.

4. The improved, accurate, low noise analog to digital converter system of claim 2 in which said sample reconstruction circuit includes a reset event correction circuit and a slope estimation computation circuit.

5. The improved, accurate, low noise analog to digital converter system of claim 1 in which said switching system includes an input hold switching circuit for isolating said integrator circuit from the input during a sampling event.

6. The improved, accurate, low noise analog to digital converter system of claim 1 in which said conditional reset circuit includes a reset switching circuit for connecting said feedback capacitor to a reference voltage source during a conditional reset.

7. The improved, accurate, low noise analog to digital converter system of claim 1 in which said switching system includes an isolation switching circuit for isolating said amplifier circuit from said feedback capacitor during a conditional reset.

8. The improved, accurate, low noise analog to digital converter system of claim 3 in which said digital computation circuit includes a storage device for storing the values of samples at sampling events and values of samples at which said feedback capacitor has been reset.

9. The improved, accurate, low noise analog to digital converter system of claim 3 in which said digital computation circuit includes a summing circuit for differencing sample values at sampling events and adding values of samples at which the feedback capacitor has been reset.

10. The improved, accurate, low noise analog to digital converter system of claim 1 in which said conditional reset circuit includes a reference voltage source.

11. The improved, accurate, low noise analog to digital converter system of claim 1 in which said conditional reset circuit includes a comparator for determining whether the integrator circuit output has reached said predetermined integrator circuit output voltage.

12. The improved, accurate, low noise analog to digital converter system of claim 1 in which said conditional reset circuit includes a reference charge source and a reset switching circuit for connecting said reference charge source to said feedback capacitor.

13. The improved, accurate, low noise analog to digital converter system of claim 1 in which said resetting occurs at the next sample event after a predetermined integrator circuit output voltage has been reached.

14. The improved, accurate, low noise analog to digital converter system of claim 1 in which said integrating circuit receives an input from a photodiode.

15. An accurate, low noise method of conditionally resetting an integrator circuit in an analog to digital system comprising:
   sampling with an analog to digital converter the output of an integrating circuit a number of times during a measuring period;
   isolating the input from the integrating circuit during a sample event;
   generating a reset signal in response to the integrating circuit output reaching a predetermined level; and resetting the feedback capacitor of the integrating circuit by isolating it from the amplifier circuit of the integrating circuit and connecting it to a reference source during a sample event.

16. The method of claim 15 further including determining the difference between the values of each sample occurring during a measuring period and adding the value of any sample at which the feedback capacitor has been reset for reconstructing the output of said integrator circuit.

17. The method of claim 16 further including storing the values of samples at sampling events and values of samples at which said feedback capacitor has been reset.

18. The method of claim 15 in which said reference source includes a voltage reference source.

19. The method of claim 15 in which said reference source includes a charge reference source.

20. The method of claim 15 in which resetting occurs at the next sample event after a predetermined integrator circuit output voltage has been reached.

21. The method of claim 15 in which said integrating circuit receives an input from a photodiode.

* * * * *